(12) United States Patent
Honda et al.

(10) Patent No.: US 7,449,898 B2
(45) Date of Patent: Nov. 11, 2008

(54) METHOD AND APPARATUS FOR REVIEWING DEFECTS BY DETECTING IMAGES HAVING VOLTAGE CONTRAST

(75) Inventors: Toshifumi Honda, Yokohama (JP); Takehiro Hirai, Ushiku (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 11/704,228

(22) Filed: Feb. 9, 2007

(65) Prior Publication Data
US 2007/0222464 A1 Sep. 27, 2007

(30) Foreign Application Priority Data
Mar. 24, 2006 (JP) .............................. 2006-081882

(51) Int. Cl.
*G01R 31/00* (2006.01)
*G01R 31/305* (2006.01)
*G01N 23/00* (2006.01)

(52) U.S. Cl. ...................... 324/751; 324/500; 324/501; 250/310; 250/311

(58) Field of Classification Search ......... 324/500–501, 324/751; 250/310–311
See application file for complete search history.

(56) References Cited
U.S. PATENT DOCUMENTS
6,476,388 B1 * 11/2002 Nakagaki et al. ............ 250/310
6,642,726 B2    11/2003 Weiner et al.
6,650,129 B1 *  11/2003 Katayama .................... 324/751
7,012,439 B2 *   3/2006 Pinto et al. .................. 324/751
2002/0149381 A1* 10/2002 Lo et al. ....................... 324/751
2003/0210062 A1* 11/2003 Katayama .................... 324/751
2004/0207414 A1  10/2004 Verma et al.

FOREIGN PATENT DOCUMENTS
JP      10-135288      5/1998
JP      2003-098114    4/2003

* cited by examiner

*Primary Examiner*—Ha Nguyen
*Assistant Examiner*—Karen M Kusumakar
(74) *Attorney, Agent, or Firm*—Antonelli, Terry, Stout & Kraus, LLP

(57) ABSTRACT

In a traditional method for automatically obtaining high-magnification images of defects by using an electron microscope for defect-reviewing of a semiconductor wafer, high-magnification images of a voltage contrast changing part are obtained in the case of defects generating voltage contrast change, this made difficult to observe defects themselves generating voltage contrast change. In the present invention, based on energy of secondary electron to be detected, after obtaining two types of images, namely an image making voltage contrast conspicuous easily, and an image not making it easily, and acquiring a shape change area adjacent to a voltage contrast change area based on this area as a defect location, a high-magnification image can automatically be obtained.

14 Claims, 6 Drawing Sheets

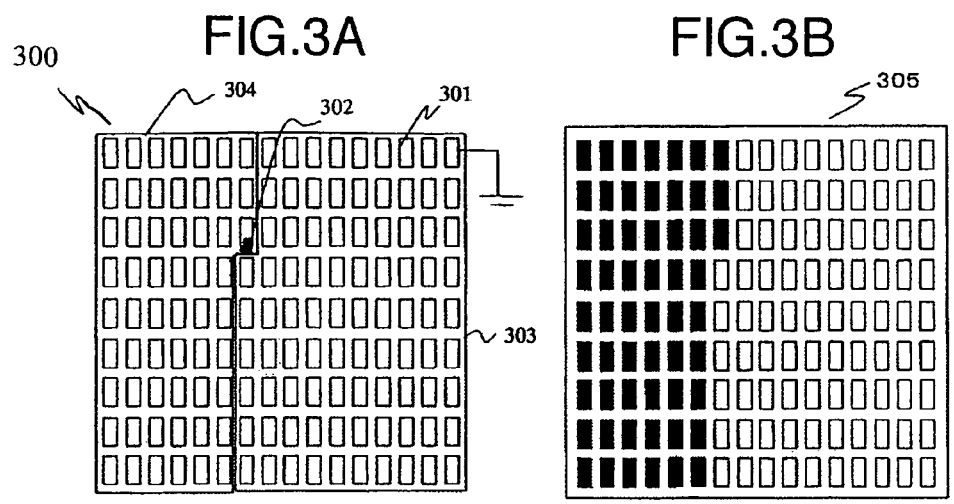
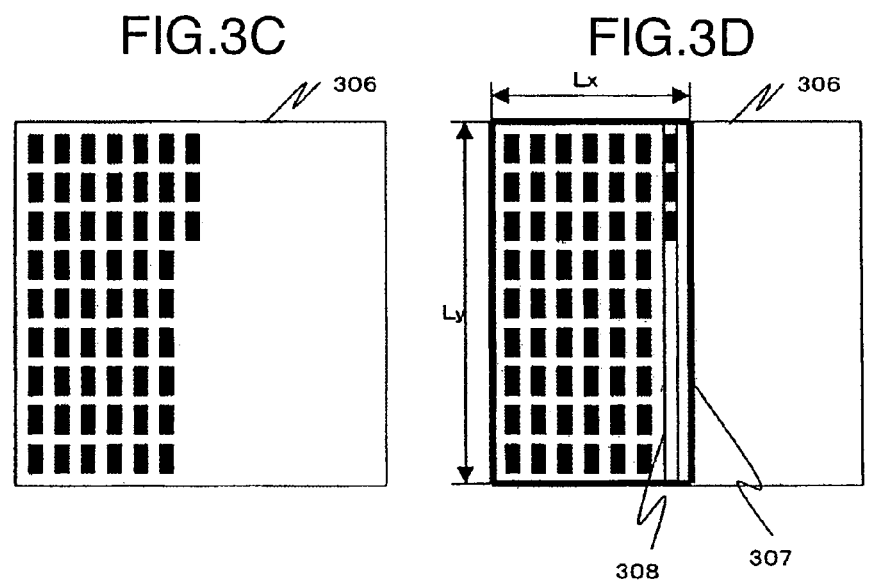
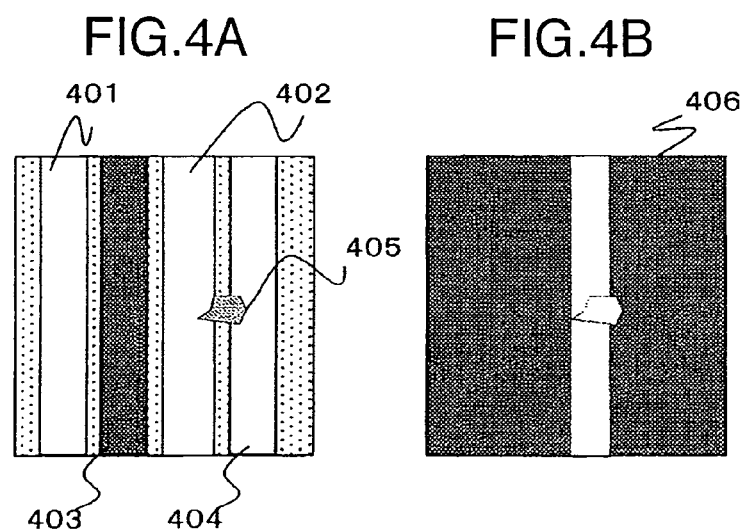

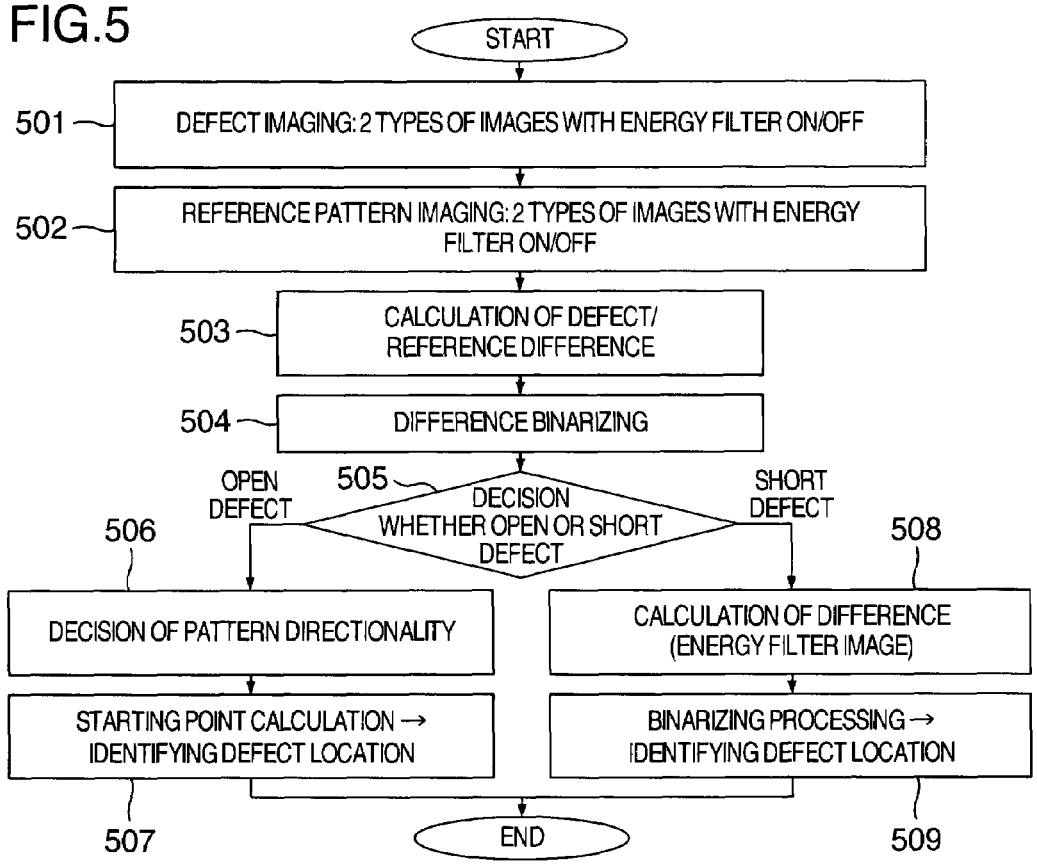
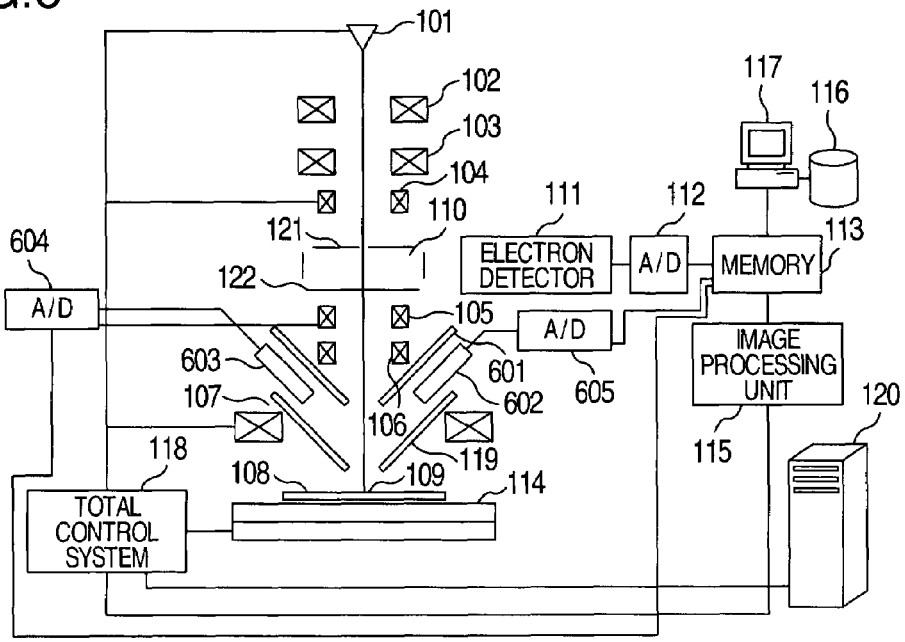

FIG.7A
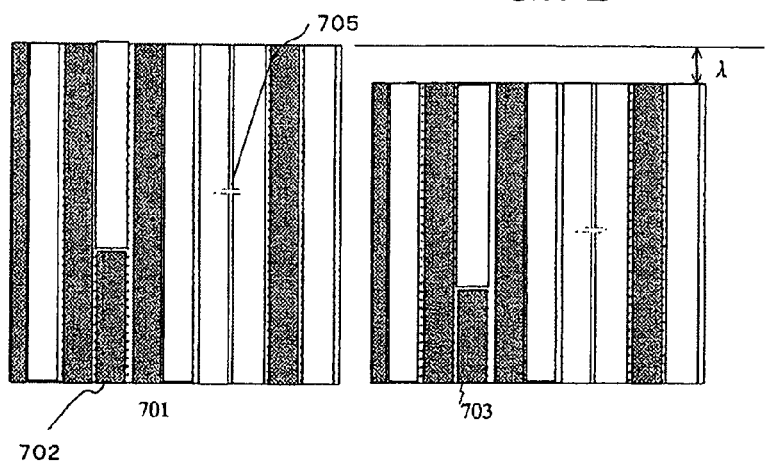
FIG.7B
FIG.7C
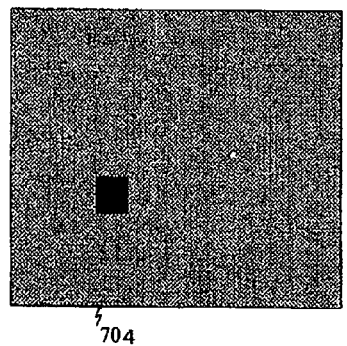
FIG.7D
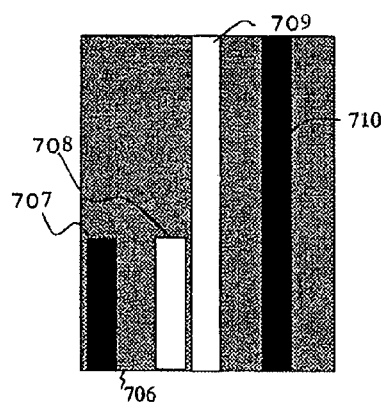
FIG.8A
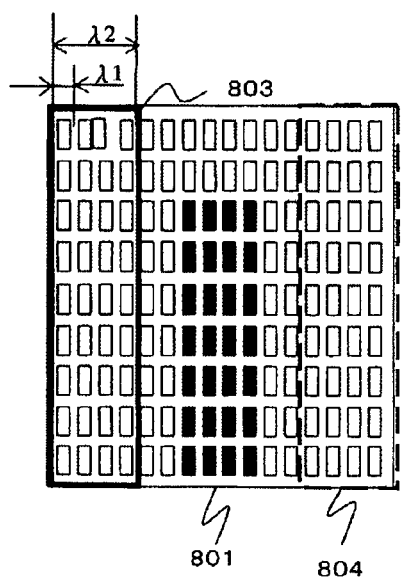
FIG.8B
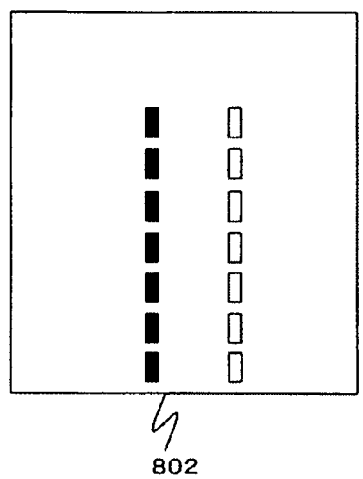

METHOD AND APPARATUS FOR REVIEWING DEFECTS BY DETECTING IMAGES HAVING VOLTAGE CONTRAST

INCORPORATION BY REFERENCE

The present application claims priority from Japanese application JP2006-081882 filed on Mar. 24, 2006, the content of which is hereby incorporated by reference into this application.

BACKGROUND OF THE INVENTION

This invention relates to a scanning electron microscope (hereinafter referred to as SEM) to obtain images of an observation object, by irradiating a focused electron beam to a semiconductor device in course of manufacture at a front-end semiconductor device process, and detecting electrons released from the irradiating location, and in particular, relates to a SEM type semiconductor wafer inspection apparatus required to obtain high-magnification images, a review SEM to observe defects detected in a semiconductor wafer, in more detail, and further a method for reviewing, in high-magnification, defects having voltage contrast at an inspection apparatus detecting the defects and an apparatus thereof.

With miniaturization of semiconductor devices, it has become increasingly difficult to control a front-end semiconductor device manufacturing process, and it has been important to inspect and review after a circuit is formed. As known examples concerning general inspection and review, an example disclosed in JP-A-10-135288 is well-known, wherein such a sequence is disclosed: inputting, by a review unit, defects coordinates detected by an inspection apparatus using mainly an optical microscope; obtaining low-magnification images after transferring the field of view of a SEM type review apparatus into the coordinates; and after localizing a defect location from the image obtained, obtaining high-magnification images at the defect location. However, by a review, which is also shown in this known example, conducted after inspection by using an optical microscope, with multi-stratification of a semiconductor device pattern, and, further, due to the increase in aspect ratio by finer patterning trend, it has become difficult to observe defects generated at the bottom having trench configuration between patterns, by an optical microscope.

A problem of high aspect ratio is more serious concerning defects generated at the bottom of a hole, and it is almost impossible to detect by an optical inspection apparatus. Therefore, though an inspection based on images obtained by a SEM has prevailed to detect these defects, imaging by a SEM has a problem that time required for imaging by a SEM is generally longer than that by an optical microscope; this disables to inspect with high throughput. To solve this problem, recently a method has been conducted, wherein a test pattern different from an actual circuit of a semiconductor device is formed and only this test pattern is inspected.

As a well-known example of this method, for example, as disclosed in US 2004/0207414, an inspection method is known, wherein, a test pattern, in which voltage contrast (potential contrast) is easily changed, is formed when electrical defects are generated in a semiconductor device, and after detecting first a pattern generating voltage contrast, only the pattern generating voltage contrast is inspected; this enables to inspect relatively at high speed even by a SEM type inspection apparatus.

Further, as a method for distinguishing defects generating voltage contrast from shape defects, as disclosed in U.S. Pat. No. 6,642,726, there is a method, wherein, in the case where a defect size is large and the ratio of a short side to a long side of a rectangular area in an area detected, is large, the defects are classified as ones generating a voltage contrast phenomenon, and it is judged that the defect location is a position where brightness changes in the case of open defects, and a defect area extends across patterns in the case of short defects.

Further, as a method for finding a defect location, though there is no description on voltage contrast change, for example, as described in JP-A-2003-098114, a method is disclosed, wherein, for an image of defects, parts where the same pattern is imaged at different positions, are searched by every local region; and a reference image is composed based on the pattern searched; and a defect location is detected by comparing the defect image with a comparison image composed; this enables to calculate a defect location without imaging a reference image.

Among conventional methods described above, first in the review method disclosed in JP-A-10-135288, it had a problem of difficulty in obtaining a high-magnification image of defects. Generally, with fatal defects generated on a test pattern, voltage contrast change is caused due to electrical characteristic change generated by the defects. In the well-known example, because a high-magnification image is obtained by comparing a defect image with a reference image, and then the difference is detected as defects, the central part of a voltage contrast change area, which is imaged relatively large, is imaged as a defect location. In reviewing defects, however, because what is required is, not confirming that voltage contrast change is generated, but reviewing defects themselves causing the voltage contrast, generally, this method cannot satisfy user's requirement. In addition, in the case where a high-magnification image is obtained only based on defect coordinates output from an inspection apparatus, because stages for moving a wafer are basically different between those in an inspection apparatus and in a review apparatus; this leads to insufficient correspondence between coordinates, and it becomes difficult to obtain a defect image, because defects are not located within a small field of view, which is indispensable in the case of trying to inspect defects at high-magnification.

Further, U.S. Pat. No. 6,642,726 describes, as a method for finding defects on a test pattern in a SEM type inspection apparatus, methods for finding a defect location from defects with voltage contrast by a SEM, including a method for distinguishing voltage contrast defects from a physical defects; and a method for identifying a defect location of defects causing voltage contrast, however, these methods have a problem of inability to stably detect short defects. A SEM type review apparatus is required to review defects with voltage contrast, however, an enlarged field of view of a review apparatus is required to observe defects detected by a SEM type inspection apparatus, by a review apparatus, regardless of alignment error between a SEM type inspection apparatus and a review apparatus. Meanwhile, in the well-known example, it is described that defects which cause short defects are extracted as defects which connect a pattern having voltage contrast difference between a defect image and comparison image thereof, and a pattern adjacent to the pattern, however, in the case of imaging at a wide field of view, a distance between patterns is imaged as quite short. In the case where voltage contrast is generated, it is common that defects are imaged as bright as a pattern and it is difficult to identify a location, in particular, in the case of microscopic defects present between patterns.

Further, as the second problem, in the case where difference of voltage contrast is generated, and in the case where a reference image is composed by using the a method disclosed in JP-A-2003-098114, because difference by voltage contrast is imaged comparatively large, a problem arises of a phenomenon that brightness change remains due to voltage contrast generated by a defect, occurs in a reference image; this makes it impossible to detect the whole of voltage contrast abnormal parts. In particular, in voltage contrast generated from open defects, this becomes a problem to find a defect location. In open defects, as described in U.S. Pat. No. 6,642,726, it is important to find a starting point where voltage contrast difference starts, however, when a reference image is poorly composed, the difference area which is normally one area, is detected as separated ones; this disables to stably find a starting point of voltage contrast.

SUMMARY OF THE INVENTION

The present invention provides a method and an apparatus thereof to stably review defects such as short defects and open defects with voltage contrast, detected by other apparatuses.

That is, the present invention is accomplished by inputting a defect location obtained by an inspection of an observation object; obtaining a SEM image so as to have defects with voltage contrast detected by other inspection apparatus (for example, a SEM type defect inspection apparatus), located in a field of view; comparing the image obtained, with an image of a normal part, identifying a defect location from difference generated by any of defects or voltage contrast change caused by defects, or by both thereof, and obtaining a higher-magnification image at the defect location obtained. Further, it is possible to solve a problem to stabilize defect location accuracy, by imaging both images; namely, an image with voltage contrast easily made obvious and an image without, as these images.

Additionally, in the present invention, a reference image which corresponds to an image of a normal part used for calculating the difference is created from an image of a field of view including a defect obtained by a SEM imaging.

The present invention enables to review defects themselves, which generate voltage contrast, including short defects caused by microscopic defects generated between patterns. Further, it becomes possible to stably identify a starting position of a voltage contrast abnormal part caused by open defects.

These and other objects, features and advantages of the invention will be apparent from the following more particular description of preferred embodiments of the invention, as illustrated in the accompanying drawings.

BRIEF DESCRIPTION OF THE DRAWINGS

FIG. 3A is a drawing showing an example of a test pattern area where open defects are generated.

FIG. 3B is a defect image accompanied with a voltage contrast image (open) obtained by imaging the sample shown in FIG. 3A by a SEM.

FIG. 3C is a difference image of voltage contrast obtained by comparing the defect image in FIG. 3B, with a reference image having no defects.

FIG. 3D is a drawing showing projection length of the difference area obtained by grouping the difference area on the difference image of voltage contrast (open) in FIG. 3C.

FIG. 4A is a drawing showing a test pattern suitable to detect short defects.

FIG. 4B is a difference image obtained by comparing the image obtained by imaging FIG. 4A by a SEM, with a reference image.

FIG. 5 is a flowchart illustrating one example of a detecting flow for detecting defects by classifying between open defects and short ones.

FIG. 6 is other embodiment of a system configuration for reviewing defects, furnished with a SEM, and a drawing showing a configuration, wherein SEM images are simultaneously obtained by two detectors having different energy detecting ranges.

FIG. 7A is a SEM image showing a state having defects present on a test pattern.

FIG. 7B is a reference image corresponding to the test pattern in FIG. 7A.

FIG. 7C is a difference image between the defect image in FIG. 7A and the reference image in FIG. 7B.

FIG. 7D is a drawing showing a difference image between the defect image in FIG. 7A and the reference image composed of the defect image in FIG. 7A.

FIG. 8A is a SEM image of a pattern having open defects.

FIG. 8B is a drawing showing a difference image obtained by comparing the defect image in FIG. 8A with a reference image.

DESCRIPTION OF THE INVENTION

Embodiments of the present invention will be described by referring to FIGS. 1 to 12. On a semiconductor wafer, patterns are formed multilayer-structure-wise through a lot of steps. During the steps for producing the multilayer-configuration, to monitor the production process, a dimension measurement and an appearance inspection of a pattern formed by each layer, and reviewing of defects detected by the appearance inspection are implemented.

Figure 1:
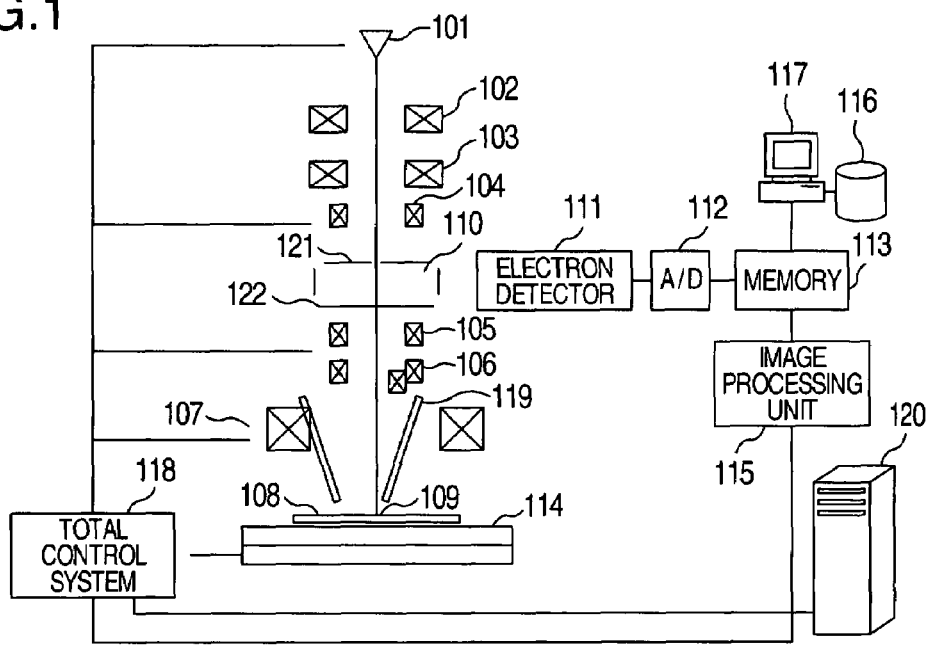
FIG. 1 is an embodiment of a basic configuration of a system for reviewing defects, furnished with a SEM.

Because the recent semiconductor device process has become increasingly finer, for imaging to make up for this, a SEM has been applied, whereby imaging with higher resolution can be obtained than imaging by an optical microscope. As a SEM used for this purpose, a review SEM has widely been used. A review SEM has a major function to image defects by an SEM, after transferring a field of view into a defect location based on defect coordinates detected by appearance inspection. FIG. 1 shows a basic configuration in the case where the present invention is applied to a review SEM.

101 is an electron beam source, which irradiates an electron beam. After the electron beam irradiated goes through condenser lenses 102 and 103, astigmatism or misalignment is corrected by an electron beam axis adjuster 104. After the electron beam is deflected by scanning units 105 and 106, and the location of emitting the electron beam is controlled, the electron beam is converged by an object lens 107 and emitted to an imaging object 109 of a wafer 108; as a result, a secondary electron and a backscattered electron are released from the imaging object 109, and strike on a reflecting board 121 having a primary electron beam through-hole, and a secondary electron generated at this location are deflected by ExB 110 and detected by an electron detector 111. The secondary electron and the backscattered electron detected by 111 are converted to digital signals by an A/D converter 112 and stored in a memory 113. 114 is an X-Y stage, which transfers 108 and enables imaging at arbitrary position of a wafer.

115 is an image processing unit, wherein a defect location is detected from an image stored in a memory 113. As this detecting method, such a method is used, that a location where difference is present, is detected as defects by comparing an image of a defect location, with an image of reference location on which the same pattern with the image of a defect location is expected to be formed. 116 is a secondary memory apparatus enabling to memorize images stored in 113. 117 is a computer terminal, which enables to display images stored in 116 or 113. Further, inputting data to the terminal 117 enables a user to set various operations of the apparatus. 118 is a total control system, which controls axis adjustment of an electron beam, deflection of an electron beam by a scanning unit and movement of a field of view by transferring the XY-stage movement. 119 is an electrode for generating an electric field, and enables to control a surface electric field of a wafer 108 by the total control system 118.

120 is a recipe-server, wherein a data-file is stored, in which defect coordinates output from an inspection apparatus performing inspections of a wafer, and the data-file is transferred to the total control system 118, whereby imaging sequence for obtaining a defect image is controlled. In addition, it is also possible to store in the recipe-server 120, images stored in 116 and the results transferred after processing of the images. 122 is an energy filter, by which electric field is locally generated so that electrons emitted from the wafer 108 can not pass through, in the case where their energy level is low.

Figure 2:
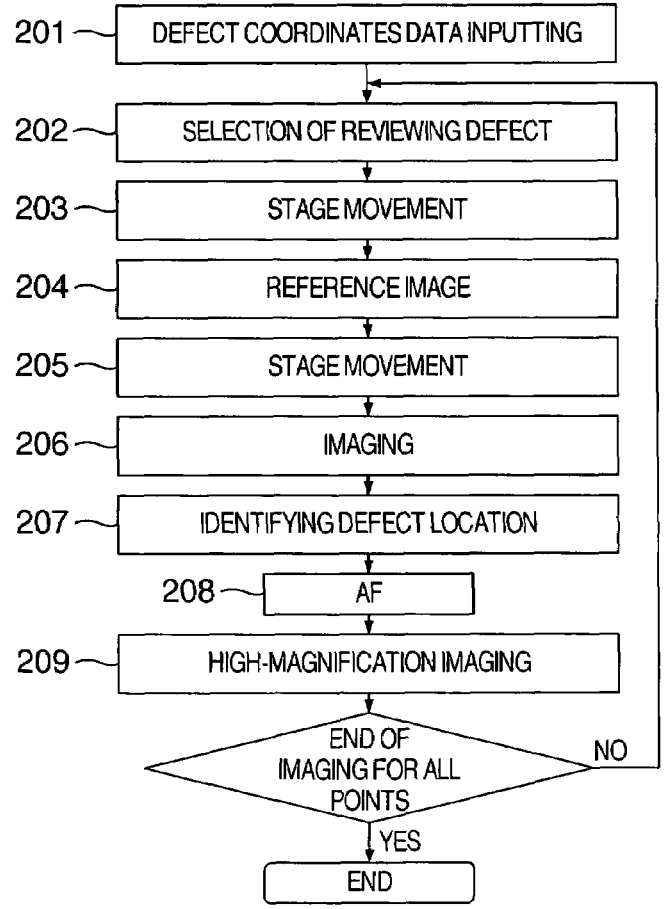
FIG. 2 is a flowchart illustrating a sequence for obtaining images of defects automatically.

In an apparatus with a configuration in FIG. 1, a sequence to obtain a defect image is shown in FIG. 2. First, at 201, coordinate data on defects to be reviewed are input and then, at the step 202, defects to be reviewed are selected. At the step 203 the XY-stage 114 is transferred and then a reference location corresponding to defects selected at 203 are brought at the field of view of a SEM. At the step 204, a reference image is obtained and then, at the step 205, the XY-stage 114 is transferred and the defects selected at the step 206 are located within the field of view of the SEM. At the step 207, an image is obtained, and at the step 208, a defect location is identified by comparing the image obtained at 204 with image at obtained at 207. At the step 208, AF is implemented, and at the step 209, after transferring the field of view into the defect location identified at 207, a high-magnification image is obtained and the image is stored in 116. After storing the image in 116, in the case where other defects to be reviewed are present, step 202 is again performed.

Next, defects to which the present review method is applied are shown in FIGS. 3A to 3C. FIG. 3A shows an example of a test pattern area 300 where a defect 302 occurs. In this example, as the defect 302 is one causing an electrical fault, for example, in the case where open 302 is generated on a pattern 301 formed in the area 300 where a large pattern having high capacitance like the test pattern is formed, the area irradiated by an electron beam charges positively when an electron beam is irradiated on this area, because the number of secondary electrons released is larger than that of electrons irradiated under the general SEM imaging condition. In this situation, because the pattern is connected with a high capacitance area in an area 303 and, because electrons are supplied from the high capacitance area, a degree of the charging is small, even though the area irradiated by electrons charges positively.

In contrast, because a secondary electron is not supplied to an area 304, a degree of positive-charging is small. In the case where an electron is irradiated on a highly positively charged area, because a secondary electron released from the area is returned to the pattern, a dark image is obtained; on the other hand, in a lowly charged area, because secondary electron is not returned, a bright image is obtained. That is, when a sample shown in FIG. 3A is imaged by a SEM, a voltage contrast image 305 having lightness contrast as in FIG. 3B is obtained. In the case where an open defect occurs like this, the defect forms a boundary and the lightness of the patterns differs. By comparing the defect image (equivalent to the voltage contrast image 305 in FIG. 3B) obtained at the step 206 explained in the flow in FIG. 2, with the reference image obtained at the step 204, a reference image 306 of voltage contrast is calculated as shown in FIG. 3C.

In the conventional review SEM, because high-magnification images are obtained with a central focus on the difference area of the difference image 306, though the voltage contrast changing part caused by the defect can be imaged, the defect itself cannot be imaged. The present embodiment makes it possible to obtain a high-magnification image with a central focus on the defect location. Identification of an open defect occurrence location in a test pattern essentially requires to identify a defect location by obtaining a starting point of a difference area of voltage contrast, after finding directionality to which a test pattern is connected. In case of reviewing a defect by a SEM, though directionality of a test pattern can be decided based on design data, as it is not always possible to get design data easily in a review at an actual mass-production line, it is quite vital to obtain directionality of a test pattern from an image based on low-magnification defect image including aspect of difference area of voltage contrast.

For example, in the case of contact chain like FIG. 3A, by grouping the difference area on the difference image 306 of voltage contrast as shown in FIG. 3D, and by obtaining Lx and Ly by calculation of projection length of the grouping area 307 in X and Y directions, the longer one (Y in the case of FIG. 3D) can be determined as a pattern direction. Next, by tracing the difference area 308, which is located close to the center of a field of view, in the pattern direction, that is, in an X direction orthogonal to a Y direction, to this pattern direction, that is the Y direction; and by finding a boundary of an area having difference from signal change on the difference image 306 in the difference area 308, the generating location of an open defect can be identified. As described above, even in the case where voltage contrast change occurs in a wide area, both in a defect image and a reference image, defect location can be identified. A direction, in which voltage contrast occurs, is obtained here based on images, however, obviously it is also acceptable to use CAD data or to provide inspection data with information concerning the direction in which voltage contrast change occurs.

In FIG. 4A, a structure of a test pattern suitable to detect a short defect is shown. 401 and 402 are conductive patterns, which are connected with a pattern with high capacitance. In contrast, 403 and 404 are patterns of floating. In 401 and 402, even when a secondary electron is released with irradiation of an electron beam, an image obtained is bright, because electrons are supplied from an area having high capacitance. However, in 403, an image is dark, electrons are not supplied. 405 is a defect generated across areas with these two different types of patterns. As electrons are supplied to the pattern 404 from this defect 405, the pattern which should be imaged essentially dark due to floating, is imaged bright. As a difference image 406 obtained from the difference between the FIG. 4A, as a defect image, and a reference image (not shown), becomes as shown in FIG. 4B, it is impossible to stably identify a defect location in the case based on this image.

As a result of studying the above problem, it was found that, in this case, it is impossible to stably detect a defect location unless imaging is performed so that difference of voltage contrast does not become obvious. The main reason for this is that when low-magnification SEM image is obtained in a field of view including a base part adjacent to a pattern with high capacitance, it becomes difficult to find a short defect across patterns from the image, because the image is obtained in similar brightness as in a pattern having high capacitance. One method to solve this problem includes the following method, wherein imaging is performed by detecting a secondary electron and a backscattered electron having high-energy among the secondary electron and the backscattered electron released from an observation object; this can be realized, for example, in the configuration shown in FIG. 1, by cutting a secondary electron having low energy by using an energy filter 121.

In general, a generating mechanism of a difference area of voltage contrast is that charged electric potential of a target object rises due to irradiation of a primary electron beam, and secondary electrons having low energy generated at the observation object, returns to the observation object again. Generally, because charged potential is often lower than or equal to 20 V (however, this value depends on the size of a field of view), secondary electrons higher than or equal to 20 V do not return to an observation object and change of voltage contrast caused by defects, does not practically occur. Therefore, when the potential of an energy filter 121 is controlled so that only electrons having energy higher than or equal to 20 V are detected, a defect location can be identified without influenced by voltage contrast, because an image having no voltage contrast can be obtained.

In some cases, however, because an open defect can not be identified in an image without generating voltage contrast change, after two types of images are obtained with and without energy-cutting by an energy filter, a defect location can stably be calculated from an image obtained, for example, in the state of not performing energy-cutting for an open defect, and in the state of performing energy-cutting for a short defect. Further, as for an open defect and a short defect, by judging whether voltage contrast change becomes brighter or darker than a difference image obtained from an image without energy-cutting, they can be decided as follows: in the case of becoming darker, a defect is an open defect, and in the case of becoming brighter, it is a short defect.

Note that an electric field to be generated by an energy filter requires setting from an observation object, in consideration of potential difference between an observation object and an energy filter. For example, in the case where electric potential at an observation object is −1200 V and electric potential at the position of an energy filter is 0 V, because electrons having an energy of 20 eV at the point of release from the observation object, come to have energy of 1,220 eV, when an electric potential of 1,220 V is generated inside the energy filter, electrons having an energy of lower than or equal to 20 V, is cut off at the point of release from the object.

A flow in this case is almost the same as that explained in FIG. 2, however, it is acceptable that each of images obtained at the steps 204 and 206 by two cases; namely one case with application of electric potential to the energy filter 121, and the other case without application. An algorithm flow is shown in FIG. 5. At defect imaging step 501, in both states that the energy filter 121 is working (ON), and is not working (OFF), both defect images are obtained and SEM defect images (defect image) are obtained; subsequently at reference pattern imaging step 502, in the both states that the energy filter 121 is working (ON), and is not working (OFF), reference pattern images are obtained and SEM reference pattern images (reference image) are obtained. Next, at defect/reference difference calculation step 503, a difference image is calculated from a defect image and a reference image obtained in the state that the energy filter 121 is not working (OFF), and at difference digitization step 504, an area having the larger difference, is extracted and binarized, and then at the open/short decision step 505, by judging whether the area extracted, is plus or minus, it is judged to be an open defect in the case of minus, and to be a short defect in the case of plus.

The pattern directionality decision step 506 is a process performed in the case of an open defect and the pattern directionality is decided based on a project length of a difference area by using the method such as explained in FIG. 3D. At the starting point calculation/defect location identification step 507, based on an image binarized at the difference digitization step 504, by searching a starting point in of the binarized image the pattern directionality decided at the pattern directionality decision step 506, the starting point is identified as an open defect location.

Next, in the case where it is concluded to be a short defect at the open/short decision step 505, the following step is the difference calculation step 508, wherein a difference image is calculated between a defect image and a reference image, the former being obtained in the state that the energy filter 121 is working (ON) by applying electric potential to the energy filter 121 at the steps 501 and 502; then at the binarizing processing/defect location identification step 509, an area which has difference at the difference digitization step 504, is expanded as a defect extraction area; and in that area, by binarizing the difference image calculated at the difference calculation step 508, a short defect location is identified.

A fault of the method for obtaining two types of images; namely in the case of cutting a low energy electron and in the case of not cutting, by the energy filter 121, is a decline of throughput caused by doubling the number of images. A method for avoiding this fault includes a system, wherein images are obtained simultaneously by not less than two detectors having different energy detecting ranges. FIG. 6 shows a basic hardware configuration in this case. The major difference from configuration explained in FIG. 1, is that two types of detectors are provided; namely one for detecting secondary low energy electrons and high energy electrons released in the normal direction of a wafer of an observation object, and the other for detecting high energy electrons released in the low-angle elevation direction.

101 to 121 in FIG. 6 have the same functions as those in FIG. 1. 601 is a reflecting board, wherein a hole is provided in the center for electrons released from an observation object to pass through. 602 and 603 are electron detectors. Electric signals output from 602 and 603, are converted into digital signals by A/D converters 604 and 605, respectively and then stored in a memory 113. Electrons are released in the normal direction of wafer surface at the potion where electrons hit by electron beam irradiation, however, electrons are gradually deflected in a direction of upward detectors, because electron field for pulling up electrons is generally formed.

While upward acting force by electron field is constant, velocity of electrons, when released from an observation object, is not constant, therefore, electrons with high energy, that is, having high velocity when released from the object have small degree of deflection by electric field, due to high having initial velocity. In contrast, electrons with low energy, that is, having low velocity when released from the object, have large degree of deflection by electric field, due to having low initial velocity. For example, in the case where acceleration voltage is about 1 KV when an electron beam is irradiated to an object, backscattered electron energy is about 1 KeV, while energy peak is 2 to 5 eV when a secondary electron is released from the object. While an electron having low energy with low initial velocity pass through the hole in the reflecting board 601 regardless of the normal direction at the point where an electron beam is irradiated, an electron having high energy with high initial velocity cannot pass through the hole in the reflecting board 601, and strike on the reflecting board 601, or are directly detected by an electron detector 602 or 603. An electron striking on the reflecting board 601, release a secondary electron again at the reflecting board, which are detected by 602 or 603.

As described above, electrons detected by the electron detector 602 or 603 become electrons entirely having high energy. Therefore, it becomes possible to form an image generating voltage contrast change based on electrons detected by the electron detector 111; and an image generating no voltage contrast change based on electrons detected by the electron detector 602 or 603.

A system is described for detecting a defect location by obtaining a reference image is described so far, however, identification of a defect location without obtaining a reference image is required to accomplish high throughput at a review apparatus. In particular, in the case where a defect on a test pattern is reviewed, a defect location is easily detected without obtaining a reference image, because a test pattern has periodicity. In locating a defect by utilization of this periodicity for a defect generating voltage contrast, however, the whole of the voltage contrast parts cannot be detected sometimes. This case is explained by using FIG. 7.

In FIG. 7A, a defect image 701 is one including a defect on a test pattern, and voltage contrast phenomenon occurs in a longitudinal direction, caused by an open defect 702. Generally, in an inspection apparatus, an inspection system called as a cell comparison system, is known; wherein a defect is detected by comparing cells themselves apart by integer times of cell part periodicity, at a memory cell part of a semiconductor device mainly; and a microscopic defect can be detected with high sensitivity, because of a system to compare cells themselves located at a relatively short distance. When this method is applied to an open defect like 702, however, an image to construct with a shift of integer times of periode ($\lambda$) as a reference image 703 in FIG. 7B, and to inspect a defect image 701 by comparison with the reference image 703, a difference image shown as a difference image 704 in FIG. 7C is obtained, and the whole of voltage contrast cannot be inspected in the case of an open defect 702.

Because a main judgment standard for voltage contrast in a test pattern is large difference of aspect ratio along the pattern at the point of voltage contrast difference, by this difference image, it is impossible to decide whether it is difference occurring by voltage contrast or difference of actual defect. It is more serious to decide in the case of a short defect 705 shown in a defect image 701, because a defect part does not appear at all in a difference image. To solve this type of a problem, it is necessary to compare defects based on periodicity of a pattern in the direction orthogonal to that where difference of voltage contrast generates, that is, in the direction orthogonal to the conductive direction of a pattern.

A difference image 706 in FIG. 7D is a difference image, calculated from a reference image (not shown) produced from a defect image 701 in FIG. 7A, according to this method, and the defect image 701; and the whole of defects including open defects and short defects can be detected. A pattern 707 in FIG. 7D is an open defect part, and a pattern 708 is a ghost part generated with reverse polarity to that of the defects because a defect part of a pattern 708 becomes reference part, however, it is possible to distinguish defects from a ghost part, based on the positional relationship between the pattern 707 and the pattern 708. A pattern 709 is a short defect part, and a pattern 710 is a ghost part of the pattern 709.

A defect is not always a small one, but there is the case where the defect extends across a plurality of patterns. For example, in the case where an open defect 801 as shown in FIG. 8A is compared with an image shifted the position by a small quantity of $\lambda 1$ relative to the defect size, the difference image becomes as a difference image 802 in FIG. 8B and the difference image part is separated into two; this suggests presence of the case where an exact defect location can not be identified. Even in this case, to make a detection of the whole of a defect part possible, the position to take out a reference image for calculating a difference image, is set apart as far as possible ($\lambda 2$); this can solve the problem. Such a setting, however, in an area which has no image to take out for comparing at a peripheral part of an image like an area 803 surrounded by a heavy line frame in FIG. 8A, makes detection of a defect impossible. A method to avoid this problem is one for detecting a defect by reversing polarity only in an area having no corresponding comparison part like an area 803 surrounded by a heavy line frame in FIG. 8A. For example, in the case where a defect image 801 in FIG. 8A is compared with a reference image (not shown) produced by shifting the position by $\lambda 2$ in the normal part, by comparing a peripheral part of an image like an area 803 surrounded by a heavy line frame in FIG. 8A, with an area 804 shifted by $-n\lambda 2$ which is surrounded by a heavy dotted line frame in FIG. 8A, it becomes possible to detect a defect in the whole image even in the case of relatively large $\lambda$.

Figure 9:
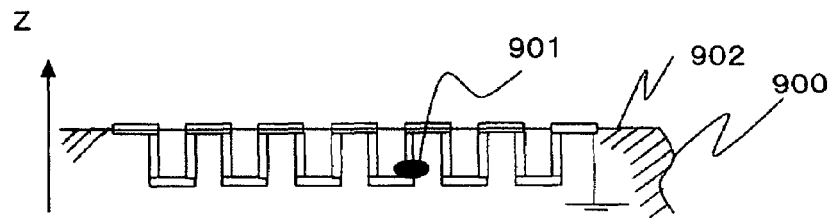
FIG. 9 is a cross-sectional drawing of a test pattern of contact chain.

As described above, it is possible to find a defect location, however, a defect is not always present on the surface of a wafer. In FIG. 9 showing a cross-sectional view of a test pattern of contact chain, in the case where a defect is present below a surface 902 of a wafer 900 like a defect 901, generally it is impossible to image this by a SEM. Conversely, in the case where a location of a defect found by an optical inspection apparatus is detected from the image obtained for reviewing by a SEM, the defect can be judged to be present below the surface, when only just difference of potential contrast is obtained.

Figure 10:
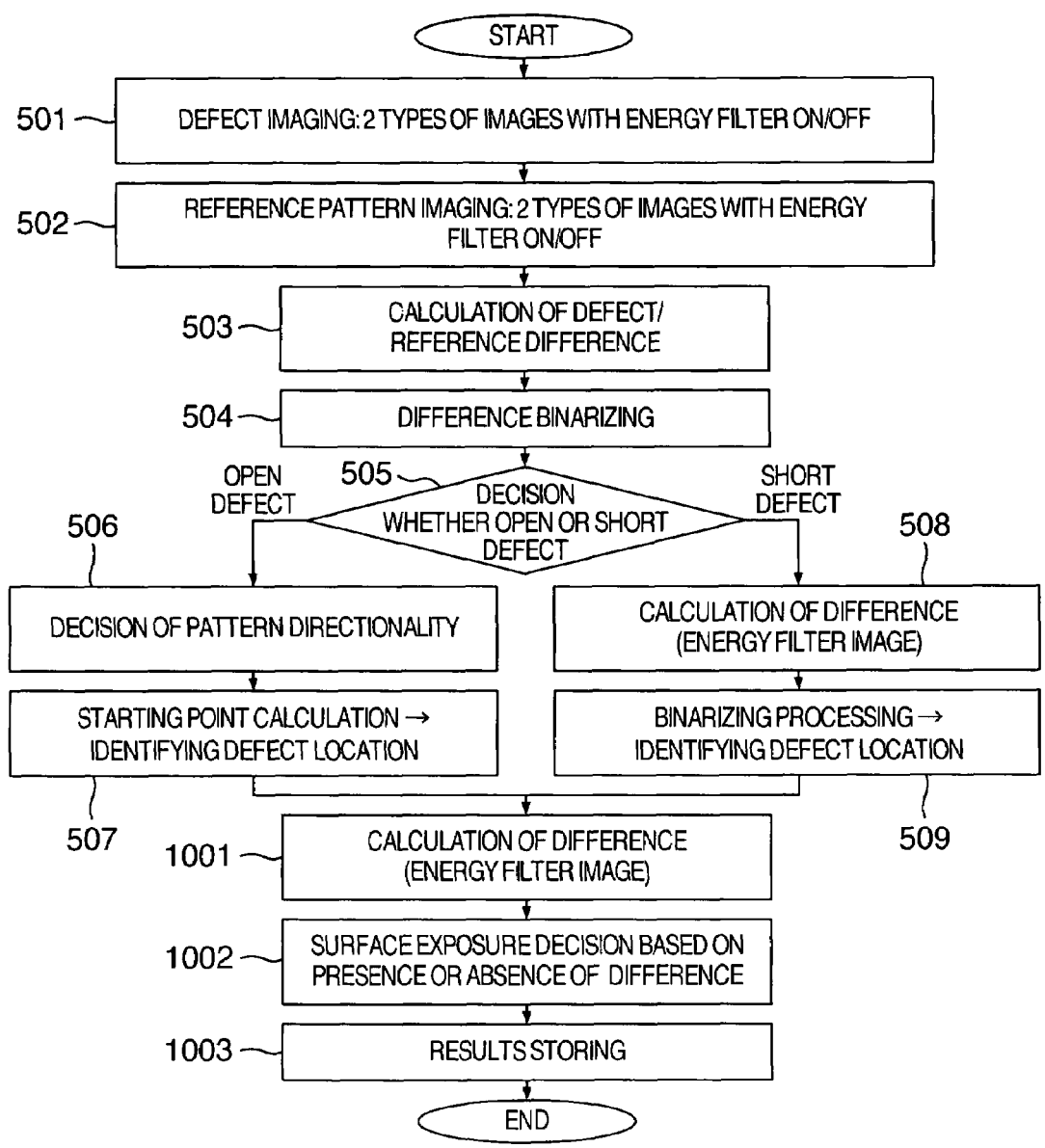
FIG. 10 is a flowchart illustrating a procedure for distinguishing defects, which cannot be observed, from those observed by a SEM.

Because, for an inspection of defects, it is quite important to know at which process said defects generated, and it is desirable to automatically judge this point in obtaining a defect image. An algorithm flow for this judgment is shown in FIG. 10. The flow in FIG. 10 is the same as that in FIG. 5 up to the step for detecting a defect location, however, at the difference calculation step 1001, difference between a defect image and a reference image, is calculated again on an image without generation of difference due to voltage contrast. At the surface exposure decision step 1002 based on presence or absence of difference, in the case where difference is generated on an image without generation of difference caused by voltage contrast, it is judged that observation of a defect is possible; and in the case where difference is not extracted, then it is judged that a defect is not exposed on the surface. The decision result performed at the surface exposure decision step 1002 based on presence or absence of difference, is stored in a secondary memory unit 116 at the result storing step 1003.

At the surface exposure decision step 1002 based on presence or absence of difference, to study the cause of a defect which is not exposed on the surface, cross-sectional processing may be carried out so that a defect is exposed to a wafer; this process is accomplished by an apparatus called a FIB. A problem to be solved in this process is positioning for cross-sectional processing by the FIB. Because it is difficult to place concentrically both an electron optical system for the FIB processing and an optical system for SEM imaging, the following method may be used: after reviewing by a SEM, cross-sectional processing is conducted by the FIB by transferring a wafer to a different unit; or with providing both a SEM optical system and a FIB optical system at different positions in the same apparatus, after reviewing by a SEM optical system, cross-sectional processing is conducted by transferring a wafer to a position where cross-sectional processing is possible by the FIB.

In the case where a wafer is transferred from a reviewing apparatus to a cross-sectional processing apparatus, even after alignment is performed, an error of ±1 μm generates, and an error of about ±0.5 μm still generates caused by stage error, even when a SEM optical system and a FIB optical system are provided on the same stage. Incidentally, because most of wiring size is generally smaller than or equal to, for example, 0.13 μm, unless identifying a defect location again after transferring the stage, cross-sectional processing cannot be performed due to lack of positioning accuracy for cross-sectional processing. Therefore, by irradiating ion beam again by a FIB optical system, and identifying a defect location again, based on an SEM image formed by detecting a secondary electron released from an object, the position for cross-sectional processing is obtained. It should be noted that ion beam irradiated in the FIB could cause contamination.

Figure 11:
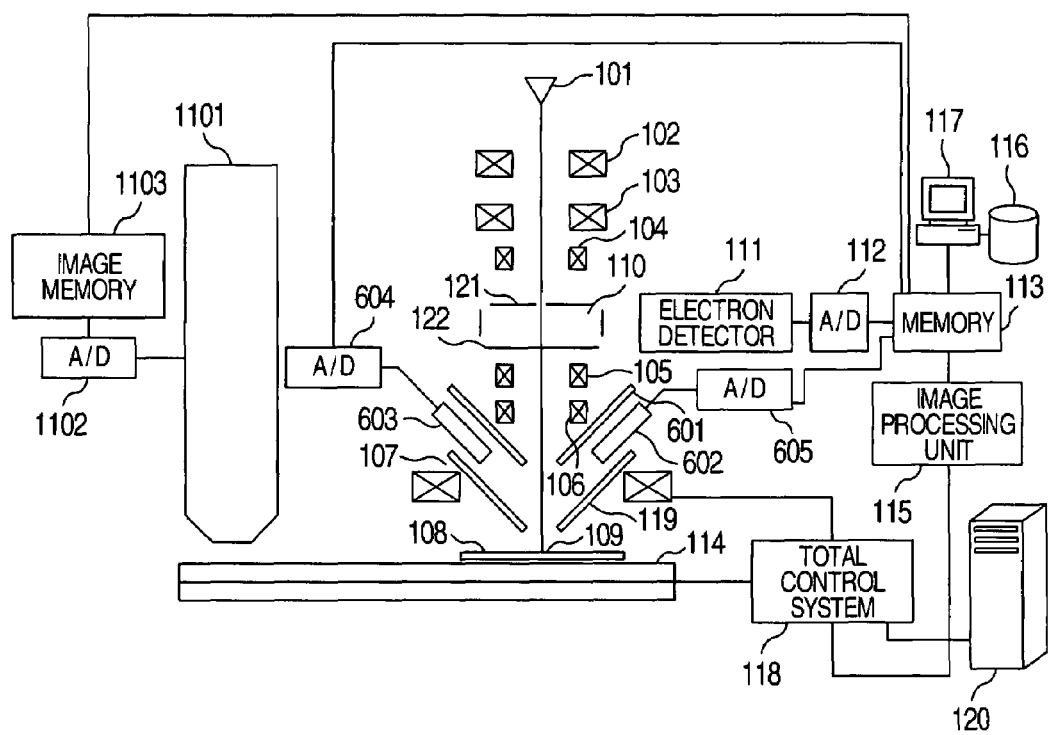
FIG. 11 is a drawing showing one embodiment of a configuration of a review observation apparatus having both a SEM observation optical system and a FIB optical system.

Therefore, it is desirable that a contaminated area be limited only to the vicinity of a defect, by identifying a defect location based on the periodicity of a defect image, without obtaining the reference image as described above. An apparatus configuration in this case, is shown in FIG. 11. 101 to 121 and 601 to 603 are identical with those in FIG. 6. 1101 is a FIB optical system, which has both an irradiation system which irradiates while scanning an ion beam, and a detection system for the secondary electron released from an object by irradiation of an ion beam. The imaging object 109 on the wafer 108, after reviewed by a SEM inspection system, is positioned at the area where an image can be obtained by 1101, by transferring of 114 so that cross-sectional processing can be conducted. 1102 is an A/D converter and 1103 is an image memory, where a secondary electron image detected by a FIB optical system is stored. An image stored in 1103 is transferred to image processing means 115 to defect location.

As a technique for detecting a defect location, a method is used for detecting a defect location from an image detected by a SEM as described above. After identifying the defect location, the position for cross-sectional processing is decided so that the defect part becomes exposed or the cross-section becomes exposed. Then the total control system 118 outputs control signals to 1101 for cross-sectional processing, and cross-sectional processing is conducted. FIG. 11 shows an embodiment, wherein a SEM optical system and a FIB optical system for observing a defect, are provided in the same apparatus, however, these are not necessarily surface mounted in the same apparatus; it may be surface mounted on different apparatuses.

A method for obtaining a high-magnification image of a defect is described thus far, on the premise of generation of voltage contrast change by a defect, however, an apparatus is not always a SEM type inspection apparatus, but there may also be a case of an optical type inspection apparatus. In this case, when generation of voltage contrast change is observed by a SEM type review apparatus, it can be confirmed that a defect detected by an optical type inspection apparatus is an electrical fault; and when there is no generation of voltage contrast change, it can be confirmed not an electrical fault.

In a general semiconductor device circuit, even when an electrical fault generates, voltage contrast change does not always generate and thus reliability of such decision is low, however, in the case where a test pattern is formed, wherein voltage contrast change generates easily, such decision can be made with high reliability.

Figure 12:
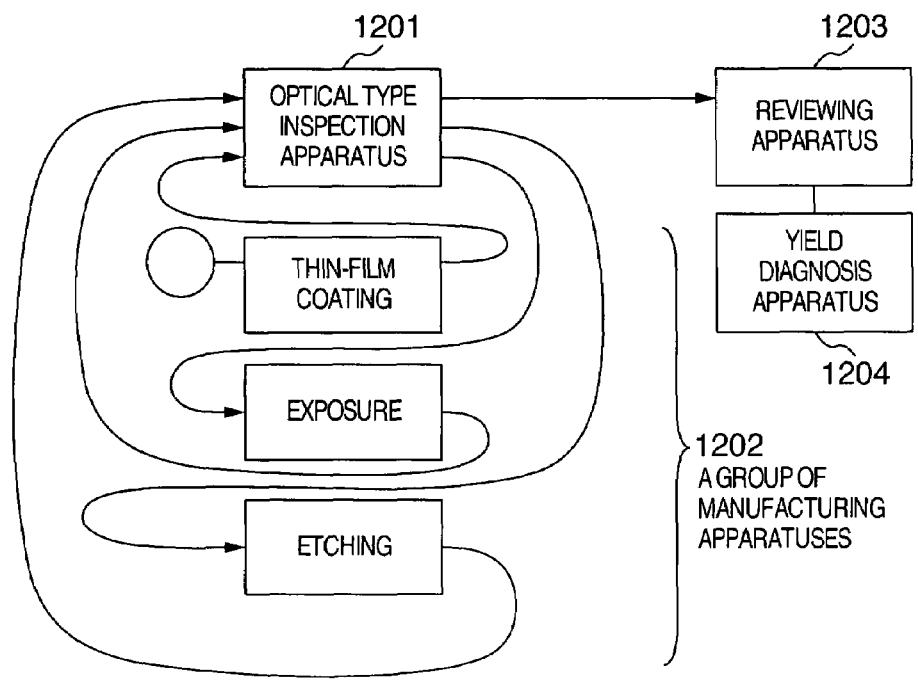
FIG. 12 is a drawing showing one example of a system configuration for identifying the cause of defects.

A schematic diagram for this case is shown in FIG. 12. 1201 is an optical type inspection apparatus, wherein inspection is performed one to several times during a pattern formation to output defect coordinates. 1202 is a group of manufacturing apparatuses. Those obtained by merging of each inspection results are used as defect coordinates. At the stage after a pattern including etching finished is formed, by reviewing a defect by 1203 based on the merged defect coordinates, it is decided whether or not a defect is accompanied by voltage contrast change. A defect with voltage contrast change is classified as an electrical defect. Based on the decision of whether or not output defect by each inspection apparatus is an electrical defect, judgment is made in which manufacturing apparatus many electrical defects are found, by a yield diagnosis system 1204; thus, it is possible to find a manufacturing apparatus having an impact on yield. As described above, the present reviewing can achieve both high-speed inspection by an optical inspection apparatus comparing with a SEM type, and yield impact evaluation by observation of voltage contrast change by using a SEM type review apparatus.

The invention may be embodied in other specific forms without departing from the spirit or essential characteristics thereof. The present embodiment is therefore to be considered in all respects as illustrative and not restrictive, the scope of the invention being indicated by the appended claims rather than by the foregoing description and all changes which come within the meaning and range of equivalency of the claims are therefore intended to be embraced therein.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A method for reviewing defects, the method comprising the following steps:

using positional information of defects on a test sample detected by a defect detecting apparatus to irradiate and scan an electron beam focused on an area including said defects in said test sample;

detecting secondary charged particles generated from said test sample, by irradiating and scanning the electron beam, under a first detection condition to obtain a first inspection image of the area including said defects;

detecting the secondary charged particles generated from said test sample, by irradiating and scanning the electron beam, under a second detection condition to obtain a second inspection image of the area including said defects;

comparing said first inspection image with a first reference image to obtain a first binarized image by voltage contrast;

comparing said second inspection image with a second reference image to obtain a second binarized image by voltage contrast; judging whether said defects are open defects or short defects from said first binarized image;

identifying a generating location of the open defects by processing said first binarized image in the case where the defects are judged as open defects as a result of the judgment; and identifying a generating location of short defects by processing said second binarized image in the case where the defects are judged as short defects as a result of the judgment.

2. A method for reviewing defects as recited in claim 1, wherein said first detecting condition is a condition detecting the secondary charged particles generated from said test sample without cutting the secondary charged particles having low energy, and said second detecting condition is a condition detecting secondary charged particles after cutting the secondary charged particles having low energy from the secondary charged particles generated from said test sample.

3. A method for reviewing defects as recited in claim 2, wherein in the case of judging whether said defects are open defects or short defects from said first binarized image, in a binarized image obtained by comparing an image obtained without cutting said secondary charged particles having low energy with a reference image, when the difference from said reference image is minus, said defects are judged as open defects, and when said difference from the reference image is plus, said defects are judged as short defects.

4. A method for reviewing defects as recited in claim 1, wherein the first reference image is an image obtained, under said first detecting condition, by detecting the secondary charged particles generated from said test sample by irradiating and scanning the electron beam focused on the area including said defects on said test sample, and said second reference image is an image obtained, under said second detecting condition, by detecting the secondary charged particles generated from said test sample by irradiating and scanning the electron beam focused on the area including said defects on said test sample.

5. A method for reviewing defects as recited in claim 1, wherein said first reference image is an image produced by composing of said first inspection image, and said second reference image is an image produced by composing of the second said inspection image.

6. A method for reviewing defects as recited in claim 1, wherein irradiating and scanning the electron beam focused on the area including said defects on said test sample is conducted twice, to obtain said first inspection image by irradiating and scanning said electron beam for the first time, and to obtain said second inspection image by irradiating and scanning said electron beam for the second time.

7. A method for reviewing defects as recited in claim 1, wherein said first inspection image and said second image are obtained simultaneously by irradiating and scanning the electron beam focused on the area including said defects on said test sample.

8. An apparatus of reviewing defects, the apparatus comprising the following configuration:

a defect location information inputting means which inputs location information of defects on a test sample, detected by a defect inspection apparatus;

an electron beam irradiating and scanning means which irradiates and scans the electron beam focused on the area including said defects, by using defect location information on said test sample having input in the defect location information inputting means;

an image obtaining means, which obtains a first inspection image of the area including said defects under the first detecting condition, and obtains a second inspection image of the area including said defects under the second detecting condition, by detecting the secondary charged particles generated from said test sample by irradiating and scanning the electron beam with the electron beam irradiating and scanning means;

an image processing means, which identifies a generating location of open defects or short defects by processing said first inspection image and said second inspection image, obtained by said image obtaining means; and an output means which outputs results of processing performed by the image processing means;

wherein said image processing means compares said first inspection image with a first reference image to obtain a first binarized image by voltage contrast; compares said second inspection image with a second reference image to obtain a second binarized image by voltage contrast; judges whether said defects are open defects or short defects from said first binarized image to identify a generating location of the open defects by processing said first binarized image in the case where the defects are judged as open defects as a result of the judgment, and to identify the generating location of short defects by processing said second binarized image in the case where the defects are judged as short defects as the result of the judgment.

9. An apparatus of reviewing defects as recited in claim 8, wherein said image obtaining means has an energy filter and a detector, which are capable of switching potential, and in the case of detection under said first detecting condition, detects, by said detector, the secondary charged particles generated from said test sample, while keeping a state of not applying potential to potential of said energy filter, without cutting the secondary charged particles with low energy, and in the case of detection under said second detecting condition, detects, by said detector, the secondary charged particles generated from said test sample, while keeping the state of applying potential on said energy filter, with cutting the secondary charged particles with low energy.

10. An apparatus of reviewing defects as recited in claim 8, wherein said image obtaining means has a first detector which detects the secondary charged particles generated from said test sample, with the secondary charged particles having low energy; a reflecting board which releases a secondary electron by irradiation of the secondary charged particles having relatively high energy, generated from said test sample; and a second detector which detects the secondary electron generated from the reflecting board.

11. An apparatus for reviewing defects as recited in claim 9, wherein, in said image processing means, for judging whether said defects are open defects or short defects, from the first binarized image, in the binarized image obtained by comparing an image obtained by detecting the secondary charged particles generated from the test sample, by the image obtaining means, without cutting the secondary charged particles having low energy, with a reference image, in the case where difference with the reference image is minus, said defects are judged as open defects; while in the case where difference with the reference image is plus, said defects are judged as short defects.

12. An apparatus for reviewing defects as recited in claim 10, wherein, in said image processing means, for judging whether said defects are open defects or short defects, from said first binarized image, in the binarized image obtained by comparing an image obtained from detecting the secondary charged particles generated from the test sample, by said image obtaining means, without cutting the secondary charged particles having low energy, with the reference image, in the case where difference with said reference image is minus, the defects are judged as open defects; while in the case where difference with the reference image is plus, the defects are judged as short defects.

13. An apparatus for reviewing defects as recited in claim 8, wherein, in said image processing means, the first reference image which is compared with the first inspection image, is an image obtained by detecting the secondary charged particles generated from said test sample by irradiating and scanning the electron beam focused on the area including said defects on said test sample, under said first detecting condition; said second reference image which is compared with the second inspection image, is an image obtained by detecting the secondary charged particles generated from said test sample by irradiating and scanning the electron beam focused on the area including said defects on said test sample, under said second detecting condition.

14. An apparatus for reviewing defects as recited in claim 8, wherein, in said image processing means, said first reference image which is compared with the first inspection image, is an image produced by constructing the first inspection image, and in the image processing means, the second reference image which is compared to the second inspection image is an image produced by constructing the second inspection image.

* * * * *